United States Patent
Yi et al.

(10) Patent No.: US 7,377,798 B2
(45) Date of Patent: May 27, 2008

(54) IC SOCKET WITH LEVER

(75) Inventors: Qi-Jing Yi, ShenZhen (CN); Wen He, ShenZhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/581,985

(22) Filed: Oct. 17, 2006

(65) Prior Publication Data
US 2007/0087611 A1    Apr. 19, 2007

(30) Foreign Application Priority Data
Oct. 17, 2005    (CN) .................. 2005 2 0076537 U

(51) Int. Cl.
*H01R 4/50*    (2006.01)

(52) U.S. Cl. ..................................... 439/342

(58) Field of Classification Search ............... 439/342, 439/343, 264, 268, 265
See application file for complete search history.

(56) References Cited

U.S. PATENT DOCUMENTS 6,638,093 B1 * 10/2003 Chang .................. 439/342
6,814,604 B2 * 11/2004 Lee ..................... 439/342

\* cited by examiner

*Primary Examiner*—Phuong Dinh
(74) *Attorney, Agent, or Firm*—Wei Te Chung

(57) ABSTRACT

An IC socket (1) includes a base (2), a cover (5) slidably engaged upon the base, and a lever (4) for driving the cover to slide on the base. The lever includes a lateral rod (41) and a longitudinal rod (42) connected to the lateral rod. The lateral rod is received in between the cover and the base. The longitudinal rod is exposed out of the cover and the base, with a connecting section (421) of the longitudinal rod parallel to one side face of the cover, and an acting section (423) joined to the connecting section and configured to be laterally tilted towards the one side face of the cover. Thus, this configuration of the acting section of the longitudinal rod will occupy less room on a printed circuit board, and enables the lever to be engagably retained on the cover side face so as to prevent the lever from being removed by accidental touching or vibration.

3 Claims, 5 Drawing Sheets

IC SOCKET WITH LEVER

BACKGROUND OF THE INVENTION

1. Field of the Invention

The present invention relates to the art of electrical connectors, and more particularly to a lever for use in an IC socket for occupying less room on a printed circuit board.

2. Description of the Related Art

One conventional IC socket 9 is shown in FIGS. 4 and 5. The IC socket 9 comprises a base 91, a cover 94 slidably engaged on the base 91, a lever 93 received in between the cover 94 and the base 91 for driving the cover 94 to slide on the base 91. The cover 94 defines a plurality of holes 941 in rows therein. Two ears 942 and 943 are formed on one side of the cover 94. The base 91 defines a plurality of slots 911, each of which corresponds to a hole 941 of the cover 94 and remains in communication with the hole 941 when the cover 94 is driven to slide on the base 91 by the lever 93. The lever 93 comprises a lateral portion 931 and a longitudinal portion 932 joined to the lateral portion 931. The lateral portion 931 of the lever 93 is received in between the cover 94 and the base 91, while the longitudinal portion 932 thereof is exposed out of the cover 94 and the base 91. Normally the IC socket 9 is defined as in a tight status where the longitudinal portion 932 is arranged parallel to and proximate to the side face where the two ears 942 are formed, and the longitudinal portion 932 is retained in between the two ears 942. In the tight status, each pair of the hole 941 and the slot 911 firmly receives an IC pin of an IC (not shown), therefore the IC pin is not easily pulled out from the IC socket 9. When a user lifts the longitudinal portion 932 of the lever 93, the cover 94 is driven to slide forward by the lever 93 for a distance less than a width of the slot 911, thus releasing retention on the IC pin and allowing the user to pull the IC from the IC socket 9 easily. However, the conventional IC socket 9 may be accidentally loosened from its tight status due to transportation shaking or accidental touch on the longitudinal portion 932 of the lever 93. FIG. 5 illustrates the longitudinal portion 932 of the lever 93 is retained in between the two ears 942. Since the whole longitudinal portion 932 is arranged parallel to the two ears side, and only a part of the periphery of the longitudinal portion 932 is separately grasped by the two ears 942, the retention on the longitudinal portion 932 of the lever 93 is apt to be removed by accidental touching or vibration. Further, in some instances, an end of the lever longitudinal portion 932 may take up a "real estate" on a printed circuit board, where a few electronic component are needed to be equipped thereon, due to having the whole longitudinal portion 932 parallel to the two ears side. Therefore, there is a need to provide a new IC socket to resolve the above-mentioned shortcomings.

SUMMARY OF THE INVENTION

An IC socket according to an embodiment of the present invention includes a base, a cover slidably engaged upon the base, and a lever for driving the cover to slide on the base. The lever further includes a lateral rod and a longitudinal rod connected to the lateral rod. The lateral rod is received in between the cover and the base. The longitudinal rod is exposed out of the cover and the base, with a connecting section of the longitudinal rod parallel to one side face of the cover, and an acting section joined to the connecting section and configured to be laterally tilted towards the one side face of the cover. Thus, this configuration of the acting section of the longitudinal rod will occupy less room on a printed circuit board, and enables the lever to be engagably retained on the cover side face at its free end thereof so as to prevent the lever from being removed by accidental touching or vibration.

Other features and advantages of the present invention will become more apparent to those skilled in the art upon examination of the following drawings and detailed description of preferred embodiments, in which:

DETAILED DESCRIPTION OF PREFERRED EMBODIMENT

Figure 1:
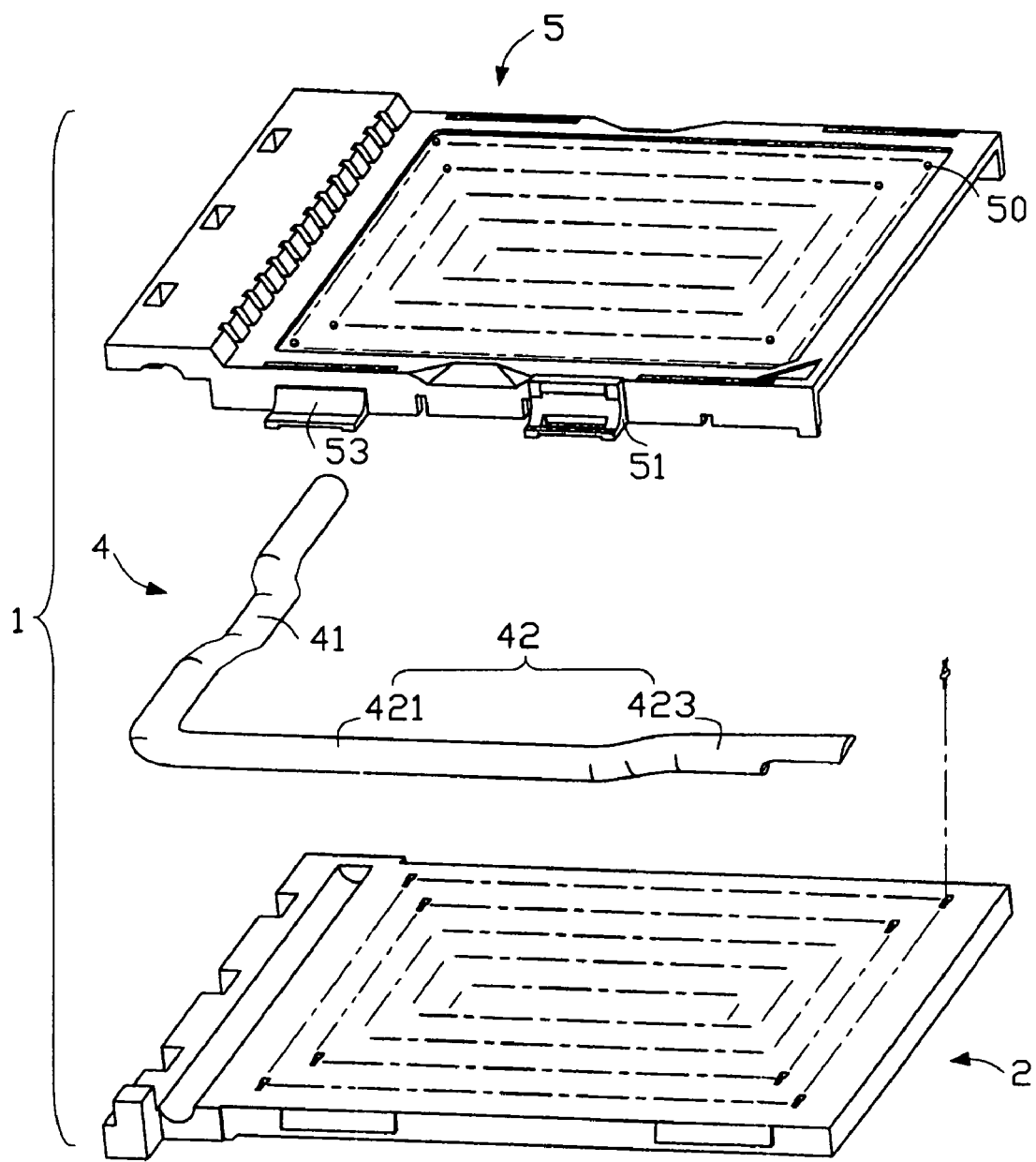
FIG. 1 is an exploded, perspective view of an IC socket according to an embodiment of the present invention.
Figure 2:
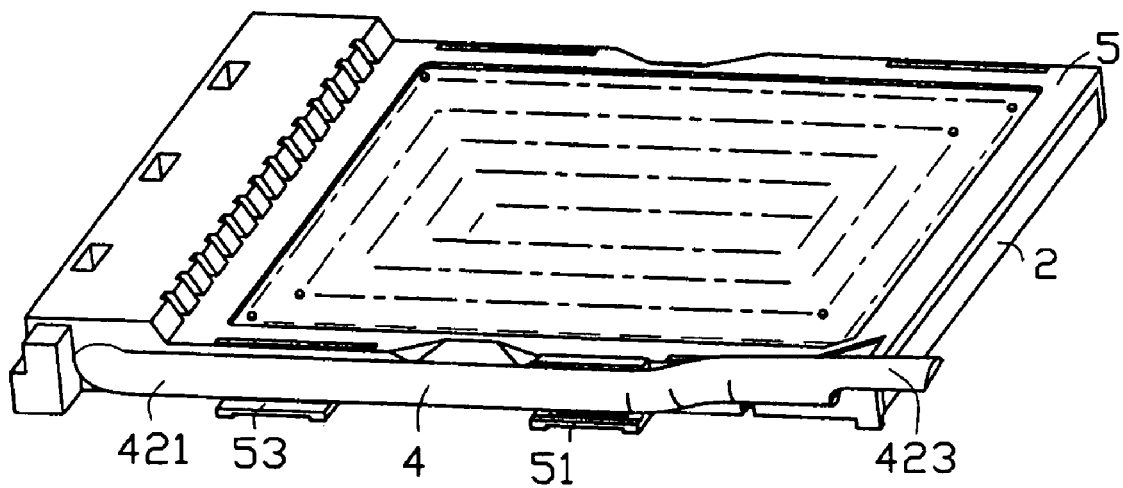
FIG. 2 is an assembled, perspective view of the IC socket of FIG. 1.
Figure 3:
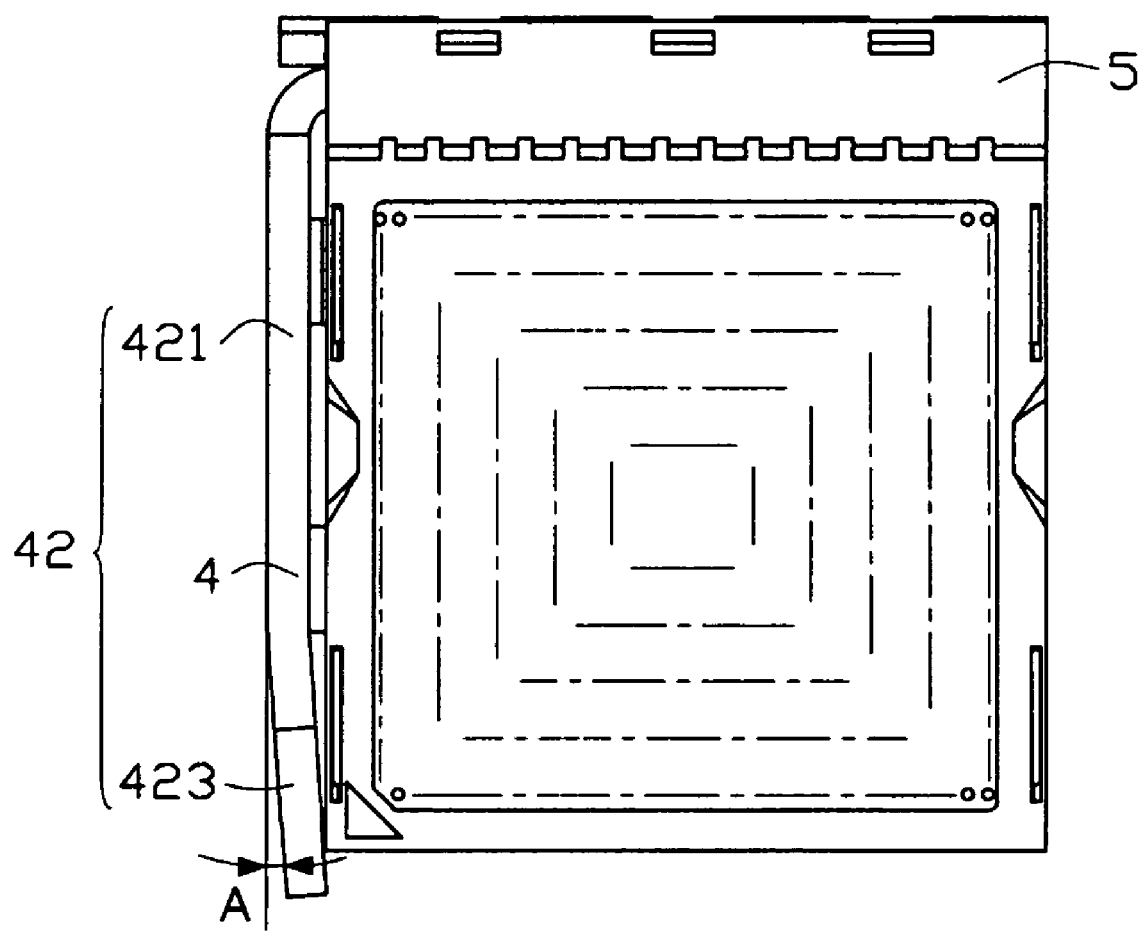
FIG. 3 is top view of the assembled IC socket of FIG. 2.
Figure 4:
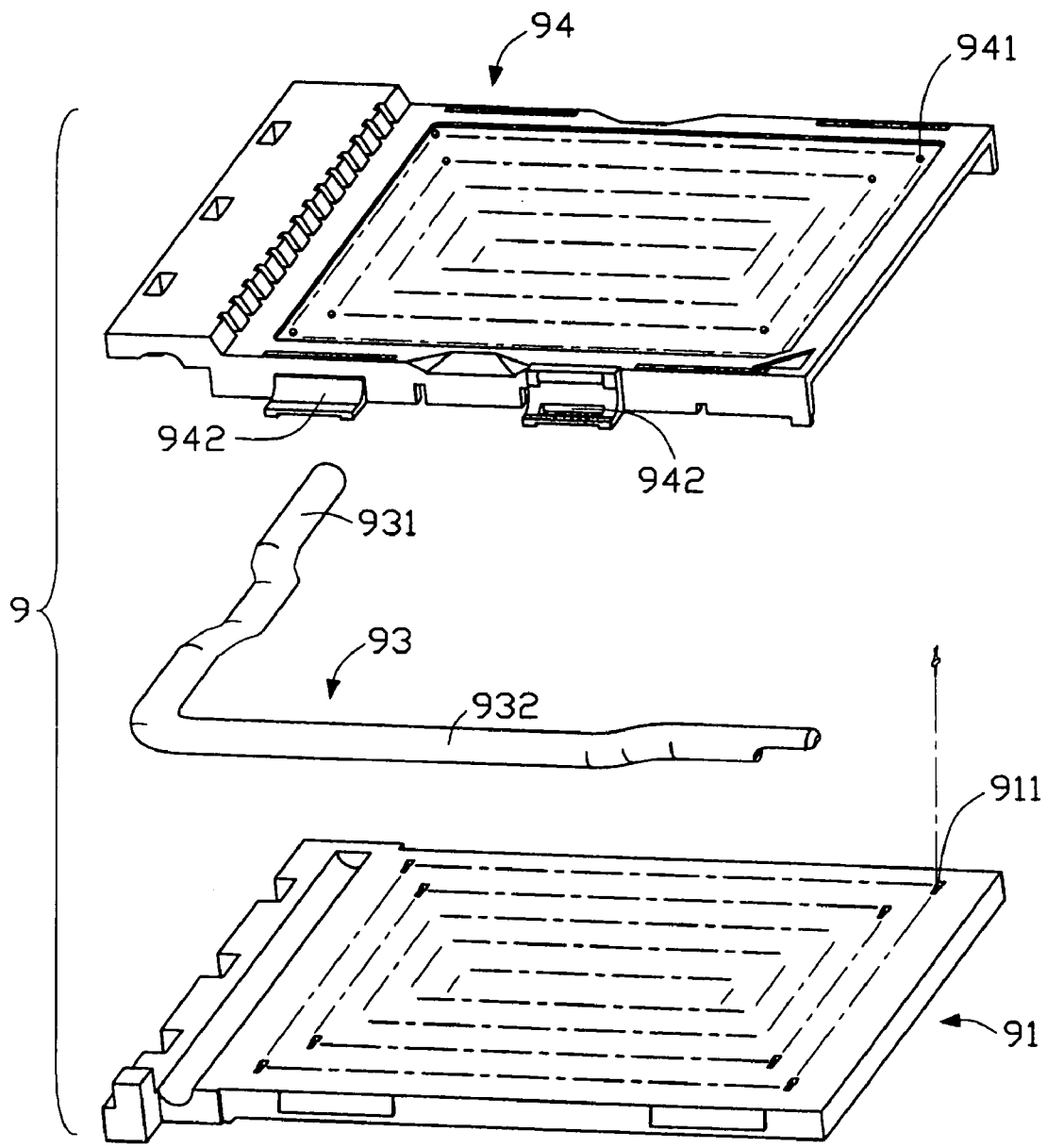
FIG. 4 is an exploded, perspective view of a conventional IC socket.
Figure 5:
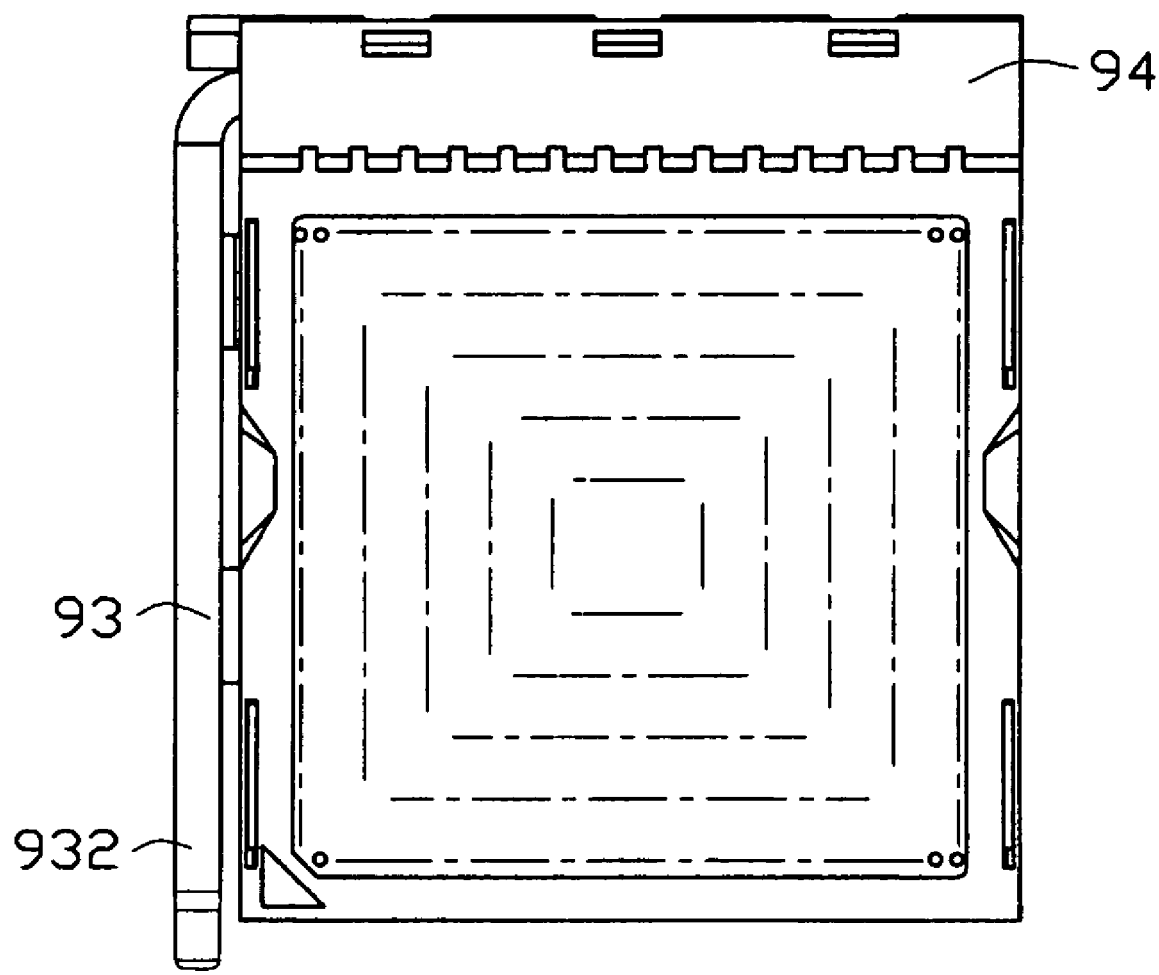
FIG. 5 is an assembled, perspective view of the conventional IC socket of FIG. 4.

Referring to FIGS. 1 to 3, an IC socket 1 according to a preferred embodiment of the present invention comprises a base 2, a cover 5 and a lever 4. The cover 5 is slidably engaged on the base 2. The cover 5 defines a plurality of holes 50 therein for receiving IC pins (not shown) of an IC (not shown). The lever 4 is received in between the cover 5 and the base 2 and is operable to drive the cover 5 to slide on the base 2 thus changing the IC socket 1 between a tight status and a released status. The lever 4 includes a lateral rod 41 and a longitudinal rod 42 connected to the lateral rod 41. Actually, the lateral rod 41 of the lever 4 is received in between the cover 5 and the base 2, while the longitudinal rod 42 is exposed out of the cover 5 and the base 2, thereby allowing the user to change the IC socket 1 from the tight status to the released status. The cover 5 includes a front ear 51 and a rear ear 53 at the same side face of the cover 5. Each of the front ear 51 and the rear ear 53 has a bottom surface formed arcuate for receiving respective portions of a periphery of a rod connecting section 421. At least one of the front ear 51 and the rear ear 53 has a width slightly greater than a radius of the rod connecting section 421. The longitudinal rod 42 of the lever 4 is operable to be positioned in between the front ear 51 and the rear ear 53, and this is defined as the tight status of the IC socket. The longitudinal rod 42 includes a connecting section 421 connected to the lateral rod 41, and an acting section 423, being free and joined to the connecting section 421. The connecting section 421 is arranged parallel to one side face of the cover 5 where two ears 51 and 53 are formed thereon, while the acting section 423 is configured to be laterally tilted towards the same side face of the cover 5 while not parallel to the side face of the cover 5. FIG. 3 illustrates an angle relationship between the acting section 423 and the connecting section 421 of the rod longitudinal portion 42, from a top view thereof. The acting section 423 and the connecting section 421 form an acute angle 'A' therebetween. Since the angle 'A' between the acting section 423 and the connecting section 421 is less than 90 degrees, the acting section 423 of the longitudinal rod 42 when lifted up (not shown) will be inclined into an extended face from the cover side face where the two ears 51 and 53 are formed. With this aspect, the longitudinal rod 42 of the lever 4 is engagably retained on the cover side face at its end of the acting section 423, when the longitudinal rod 42 of the lever 4 is operated down to be partially received in between the two ears 51 and 53 as shown in FIG. 3. Thus, with such an arrangement of the acting section 423 of the longitudinal rod 42, the longitudinal rod 42 cannot be removed by accidental touching or vibration. Further, in this embodiment, the acting section 423 of the longitudinal rod 42 has one end thereof recessed at its lower surface thereof. As compared with a conventional longitudinal portion parallel to one side face of the cover, such an inclined acting section 423 with the recessed end thereof will occupy less room on a printed circuit board (not shown), thereby allowing for some electronic components to be equipped on a region of the printed circuit board actually under the lever acting section.

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims.

What is claimed is:

1. An IC socket comprising:
   a base;
   a cover slidably engaged upon the base; and
   a lever for driving the cover to slide on the base, the lever including a lateral rod and a longitudinal rod connected to the lateral rod;
   the lateral rod being received in between the cover and the base;
   the longitudinal rod exposed out of the cover and the base, the longitudinal rod having a connecting section parallel to one side face of the cover, and an acting section being free and joined to the connecting section, the acting section configured to be laterally tilted towards the one side face of the cover, which enables the lever to be engagably retained on a die face of the cover, wherein the cover is formed with a front ear at the side face of the cover for receiving a portion of the connecting section, wherein the cover is further formed with a rear ear at the same side face of the cover for receiving another portion of the connecting section wherein each of the front ear and the rear ear is arcuate at a lower surface thereof for receiving a part of a periphery of the connecting section, wherein the acting section is recessed at a lower surface of an end of the acting section.

2. An IC socket comprising:
   an insulative housing including a base and a cover;
   said cover engaged upon the base and moveable along a front-to-back direction relative to the base; and
   a lever for driving the cover to slide on the base, the lever including a lateral rod and a longitudinal rod connected to the lateral rod;
   said lateral rod defining an engagement section to engage the cover for urging the cover to move;
   the longitudinal rod exposed out of the cover and the base and essentially located on an outside of a corresponding side face of the housing; wherein from a top view of the housing, the longitudinal rod is not a straight/linear type but a deflected type with at least two sections angled with each other including a rear section essentially extending along said front-to-back direction and a front section extending forwardly and inwardly from a front end of the rear section oblique to said front-to-back direction under a condition that said front section extends forwardly beyond a front longitudinal rod which are located on the outside of said corresponding side face, which enables the lever to be engagably retained on a die face of the cover, wherein one of side at least two section defines an abutment region engaging one of said cower and said base in a transverse direction perpendicular to said front-to back direction for generating a retention force between the lever and said one of the covert and the base, wherein said abutment region is located around a distal free end of the longitudinal rod, wherein said other defines abutment region engaging one of said cover and said base in a transverse direction perpendicular to said front-to back direction for generating a retention force between the lever and said one of the cover and the base.

3. An IC socket comprising:
   an insulative housing including a base and a cover;
   said cover engaged upon the base and moveable along a front-to-back direction relative to the base; and
   a lever for driving the cover to slide on the base, the lever including a lateral rod and a longitudinal rod connected to the lateral rod;
   said lateral rod defining an engagement section to engage the cover for urging the cover to move;
   the longitudinal rod exposed out of the cover and the base and essentially located on an outside of a corresponding side face of the housing; wherein from a top view of the housing, the longitudinal rod is not a straight/linear type but a deflected type with at least two sections angled with each other including a rear section essentially extending along said front-to-back direction and a front section extending forwardly and inwardly from a front end of the rear section oblique to said front-to-back direction under a condition that said front section experiences not only inward and lateral deflection from said top view, but also upward deflection from a side view of the housing so as to resulting in a free distal end of said front section being located at a position higher and more interior than a joint between the lateral rod and the longitudinal rod, which enables the lever to be engagably retained on a die face of the cover.

\* \* \* \* \*